(12) United States Patent
Tomokawa et al.

(10) Patent No.: US 10,558,069 B2
(45) Date of Patent: Feb. 11, 2020

(54) DISPLAY DEVICE AND METHOD OF PRODUCING THE SAME

(71) Applicant: Sharp Kabushiki Kaisha, Sakai, Osaka (JP)

(72) Inventors: Shinji Tomokawa, Sakai (JP); Takafumi Matsuda, Sakai (JP); Akiyoshi Takaoka, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/431,763

(22) Filed: Jun. 5, 2019

(65) Prior Publication Data

US 2019/0384093 A1 Dec. 19, 2019

Related U.S. Application Data

(60) Provisional application No. 62/684,239, filed on Jun. 13, 2018.

(51) Int. Cl.
*G02F 1/1345* (2006.01)
*G02F 1/1333* (2006.01)

(52) U.S. Cl.
CPC .... *G02F 1/133308* (2013.01); *G02F 1/13452* (2013.01); *G02F 1/133305* (2013.01); *G02F 2202/28* (2013.01)

(58) Field of Classification Search
None
See application file for complete search history.

(56) References Cited

U.S. PATENT DOCUMENTS

2007/0013824 A1\* 1/2007 Yu .................... G02F 1/133308
349/58

FOREIGN PATENT DOCUMENTS

JP 2008-216844 A 9/2008

\* cited by examiner

*Primary Examiner* — Richard H Kim
(74) *Attorney, Agent, or Firm* — Keating & Bennett, LLP

(57) ABSTRACT

A display device includes a panel member, a flexible substrate, and a tap. The flexible substrate includes a substrate body and a substrate extending portion. The substrate body is disposed in an area of a surface of the panel member inner than an outer peripheral edge portion of the surface. The substrate extension portion is extended from an outer peripheral edge portion of the substrate body. The substrate extension portion includes an overlapping portion overlapping a section of the outer peripheral edge portion of the surface. The tape is pasted to the area inner than the outer peripheral edge portion of the surface. The tape covers the substrate extension portion that is folded back to the substrate body from an opposite side from the substrate body such that the overlapping portion does not overlap the outer peripheral edge portion of the surface to hold the substrate extension portion.

6 Claims, 9 Drawing Sheets

DISPLAY DEVICE AND METHOD OF PRODUCING THE SAME

CROSS REFERENCE TO RELATED APPLICATION

This application claims priority from U.S. Provisional Application No. 62/684,239 filed on Jun. 13, 2018. The entire contents of the priority application are incorporated herein by reference.

TECHNICAL FIELD

The technology disclosed herein relates to a display device and a method of producing the display device.

BACKGROUND ART

Conventionally, as a display device, a display device including a panel member (liquid crystal panel) and a flexible substrate for transmitting a signal to the panel member has been known. In the display device, an outer peripheral edge portion of the panel member is attached to another member (light guide plate) with a double-sided tape, and the flexible substrate drawn out of the panel member is folded back to a rear surface of the other member, and is fixed to the other member. An example of such a display device is disclosed in Japanese Patent Application Publication No. 2008-216844.

In a case of attaching the panel member to the other member as described above, the outer peripheral edge portion of the panel member may be cleaned before the panel member is attached to the other member. In this case, if the flexible substrate is overlapped on the outer peripheral edge portion of the panel member, that overlapping portion may not be cleaned.

SUMMARY

The technology disclosed herein has been made in view of the above circumstance, and an object is to hold the flexible substrate in a state where the flexible substrate does not overlap the outer peripheral edge portion of the panel member.

(1) A display device according to an embodiment of the technology described herein includes: a panel member; a flexible substrate including a substrate body that is disposed in an area of a surface of the panel member inner than an outer peripheral edge portion of the surface and a substrate extension portion that is extended from an outer peripheral edge portion of the substrate body to an outside of the panel member and that includes an overlapping portion overlapping a portion of the outer peripheral edge portion of the surface; and a tape that is pasted to the area of the surface inner than the outer peripheral edge portion of the surface and includes a sticky surface opposed to the surface and a non-sticky surface on an opposite side from the surface. The tape covers the substrate extension portion that is folded back to the substrate body from an opposite side from the substrate body such that the overlapping portion does not overlap the outer peripheral edge portion of the surface to hold the substrate extension portion.

By the above structure, after the substrate extension portion is folded back to the substrate body, the substrate extension portion that is folded back is held by the tape. Thus, the overlapping portion can be held in a state where the overlapping state does not overlap the outer peripheral edge portion of the surface and the outer peripheral edge portion of the surface can be cleaned for sure before the outer peripheral edge portion of the surface is attached to another member. In addition, since a surface (exposed surface) of the tape that is opposite to the surface is the non-sticky surface, dust or the like adheres less to the exposed surface of the tape.

(6) Another embodiment of the technology described herein is a method of producing a display device including a panel member and a flexible substrate that includes: a substrate body that is disposed to cover an area of a surface of the panel member inner than an outer peripheral edge portion of the surface; and a substrate extension portion that is extended from the outer peripheral edge portion of the substrate body to an outside of the panel member and that includes an overlapping portion overlapping a portion of the outer peripheral edge portion of the surface. The method includes: a substrate folding back step of folding back the substrate extension portion to the substrate body such that the overlapping portion does not overlap the outer peripheral edge portion of the surface; a holding step of holding the substrate extension portion that is folded back to the substrate body by covering the substrate extension portion from a side opposite to the substrate body with a tape having a sticky surface that faces the surface after the substrate folding back step; and a cleaning step of cleaning the outer peripheral edge portion of the surface after the holding step. In the holding step, the overlapping portion can be held using the tape in the state where the overlapping state does not overlap the outer peripheral edge portion of the surface and the outer peripheral edge portion of the surface can be cleaned for sure in the cleaning step.

According to the technology disclosed herein, the flexible substrate can be held in the state where the flexible substrate does not overlap the outer peripheral edge portion of the panel member.

DETAILED DESCRIPTION

First Embodiment

Figure 1:
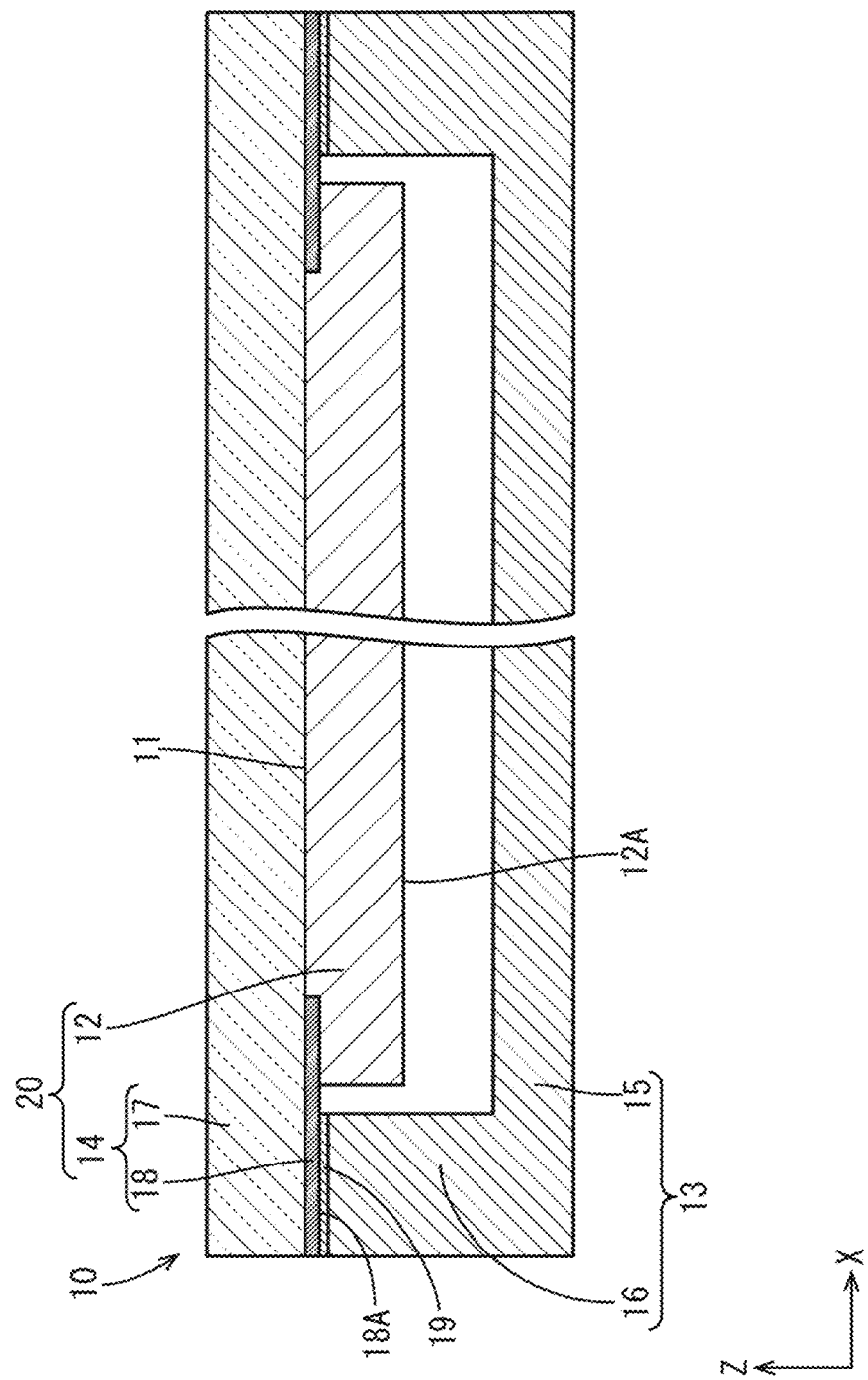
FIG. 1 is a cross-sectional view of a liquid crystal display device according to a first embodiment of the technology described herein.

A first embodiment according to the technology described herein is described with reference to FIG. 1 to FIG. 7. In the present embodiment, a liquid crystal display device 10 is described as an example of the display device. Note that an X axis, a Y axis, and a Z axis are shown in a portion of each drawing, and each axial direction coincides with the direction indicated in each drawing. The liquid crystal display device 10 is used for a mobile information terminal such as a smart phone, and has a substantially vertically long rectangular shape in plan view. As illustrated in FIG. 1, the liquid crystal display device 10 includes a liquid crystal display module 12 (display module) including a display surface 11 that displays an image, a housing 13 that houses the liquid crystal display module 12, a cover member 14 that is disposed on a front side with respect to the liquid crystal display module 12 and the housing 13, flexible substrates 21, 22, and 23 (see FIG. 2), and a tape 30 (see FIG. 2).

In the present embodiment, the liquid crystal display module 12 and the cover member 14, which have been integrated, are attached to the housing 13. As illustrated in FIG. 1, the liquid crystal display module 12 and the cover member 14 form a panel shape by the integration. In the description below, the member formed by the integration of the liquid crystal display module 12 and the cover member 14 is referred to as a panel member 20 (cover member attached liquid crystal display module).

The liquid crystal display module 12 includes a liquid crystal panel (display panel) including the display surface 11, and a backlight device that is disposed on a back side with respect to the liquid crystal panel (on a side opposite to the cover member 14) and delivers light to be used for display in the liquid crystal panel. Note that the details of the liquid crystal panel and the backlight device are not shown. The housing 13 has a substantially box-like shape that opens to the front side, and contains the liquid crystal display module 12 on the inside. The housing 13 includes a bottom portion 15 that is slightly larger than the liquid crystal display module 12 in plan view, and a frame portion 16 that rises from an outer peripheral edge portion of the bottom portion 15 toward the front side. The frame portion 16 surrounds the liquid crystal display module 12 along the whole circumference.

The cover member 14 includes a glass base material 17 with a plate shape having a light-transmitting property (cover glass), and a light-blocking portion 18 that is provided at an outer peripheral edge portion on a back surface of the glass base material 17. The glass base material 17 covers the display surface 11 of the liquid crystal display module 12, and is attached to the display surface 11 with an adhesive with the excellent light-transmitting property, such as an OCR (optical clear resin). The light-blocking portion 18 is formed of a light-blocking material (such as carbon black) that exhibits a black color and has a high light-absorbing property and a high light-blocking property. On a back surface of the light-blocking portion 18, a surface that faces an end face (attaching surface) of the frame portion 16 on the cover member 14 side is an attached surface 18A to be attached to the frame portion 16. The attached surface 18A is attached to the end face of the frame portion 16 on the cover member 14 side through an adhesive layer 19. The adhesive layer 19 is an adhesive containing a light-blocking material exhibiting a black color (such as carbon black). The attached surface 18A has a rectangular frame shape that is similar to the shape of the frame portion 16 as illustrated in FIG. 2.

Figure 2:
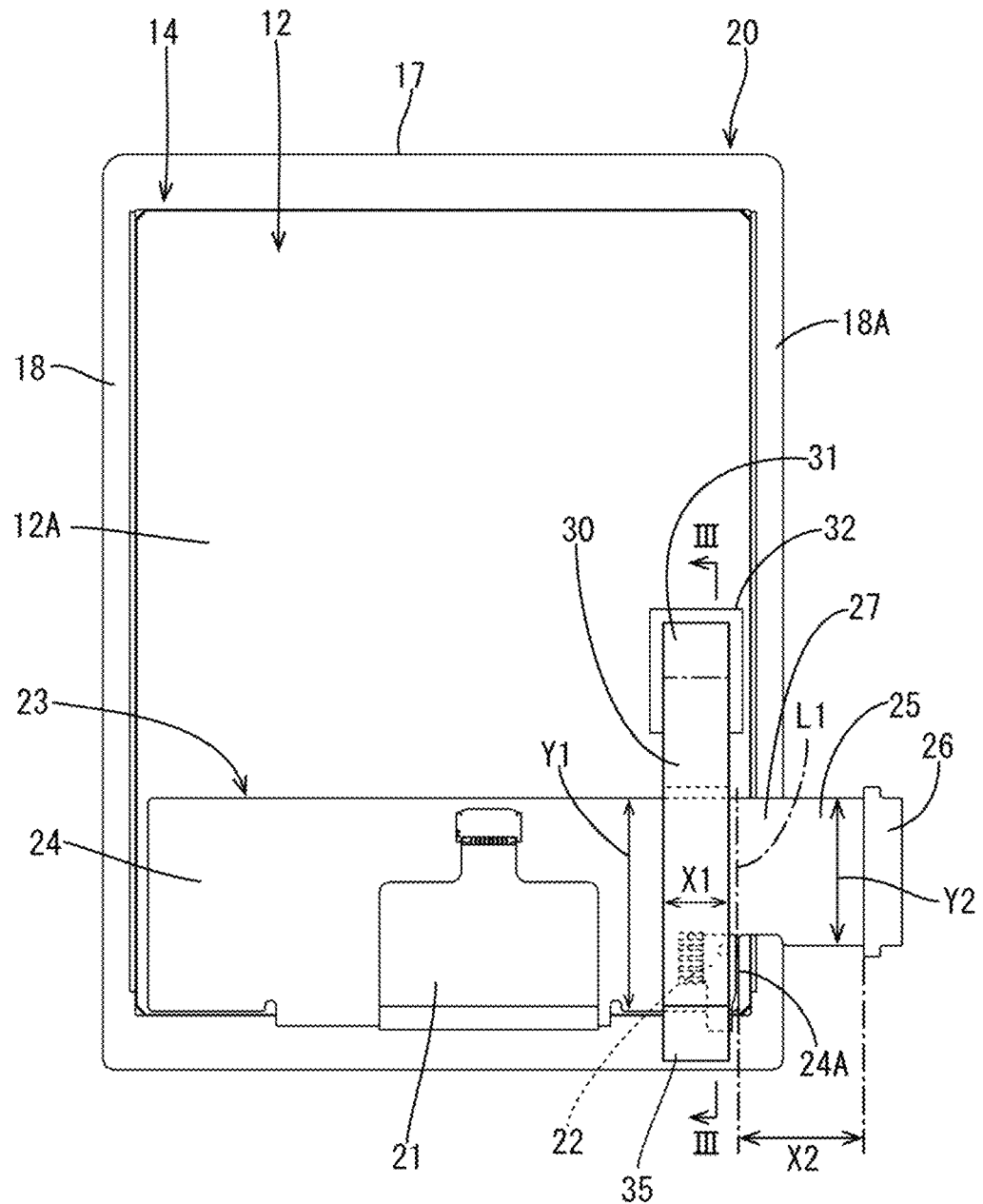
FIG. 2 is a diagram in which a panel member is viewed from a back surface (surface opposite to a display surface).

FIG. 2 is a diagram in which the panel member 20 is viewed from a back surface (surface opposite to the display surface 11). As illustrated in FIG. 2, the cover member 14 (glass base material 17) has a rectangular shape that is slightly larger than the liquid crystal display module 12, and the outer peripheral edge portion of the cover member 14 is disposed outside the outer peripheral edge portion of the liquid crystal display module 12. Therefore, the back surface of the panel member 20 (surface of the panel member) is mainly formed of the attached surface 18A of the light-blocking portion 18 (the outer peripheral edge portion of surface, a portion of the cover member), and a back surface 12A of the liquid crystal display module 12 (more specifically, a back surface of the backlight device).

On the back surface 12A of the panel member 20, the flexible substrates 21, 22, and 23 are disposed. The flexible substrates 21, 22, and 23 have one end portion thereof electrically connected to the liquid crystal display module 12. The flexible substrates 21, 22, and 23 have the other end thereof connected to a circuit board that is not shown. From the circuit board, a signal for driving the liquid crystal display module 12, for example, is supplied through the flexible substrates 21, 22, and 23. The flexible substrate 21 is disposed at a central portion in a short-side direction (X-axis direction) near one end portion of the back surface 12A (near lower end in FIG. 2). The flexible substrate 22 is disposed on one side (right side in FIG. 2) in the short-side direction (X-axis direction) at one end portion (lower end in FIG. 2) on the back surface 12A.

The flexible substrate 23 includes a substrate body 24 that is disposed on the back surface 12A (area on surface of the panel member that is inside the outer peripheral edge portion of the surface), and a substrate extension portion 25 that is extended from the outer peripheral edge portion of the substrate body 24 to the outside of the panel member 20 (to the right side in FIG. 2). At a distal end of the substrate extension portion 25, a terminal portion 26 is provided. The substrate extension portion 25 includes an overlapping portion 27 that overlaps with a portion of the attached surface 18A. The substrate body 24 and the substrate extension portion 25 are arranged in a direction along the X-axis direction. In addition, in the Y-axis direction (among directions along the plate surface of the flexible substrate, the direction orthogonal to the direction where the substrate body and the substrate extension portion are arranged), a length Y1 of the substrate body 24 is set to a value larger than a length Y2 of the substrate extension portion 25 (the width of the substrate extension portion 25). Note that the flexible substrates 21 and 22 are disposed to overlap the substrate body 24 of the flexible substrate 23.

At an end of the back surface 12A on the substrate extension portion 25 side, a tape 30 is disposed. The tape 30 is long in the Y-axis direction, and is pasted to the back surface 12A at one end portion 31 of the tape 30 in a longitudinal direction. The tape 30 is disposed to cover a peripheral edge portion of the substrate body 24 on the substrate extension portion 25 side, and a portion of a right end face of the tape 30 in FIG. 2 is adjacent to an end face 24A of the substrate body 24 on the substrate extension portion 25 side. In addition, at a place on the back surface 12A that corresponds to the one end portion 31 of the tape 30, a mark 32 is formed. The mark 32 is used to determine a pasting position on the back surface 12A where the one end portion 31 of the tape 30 is pasted. The mark 32 has a shape that is similar to the outer shape of the one end portion 31, and specifically, has a U-like shape that opens downward in FIG. 2. This mark 32, which is formed by a scribing line, for example, may alternatively be formed by other structure than the scribing line (such as printing). The shape of the mark 32 is not limited to the U-like shape, and may be any shape that enables an operator who pastes the tape 30 to determine the pasting position to paste the tape 30.

Figure 3:
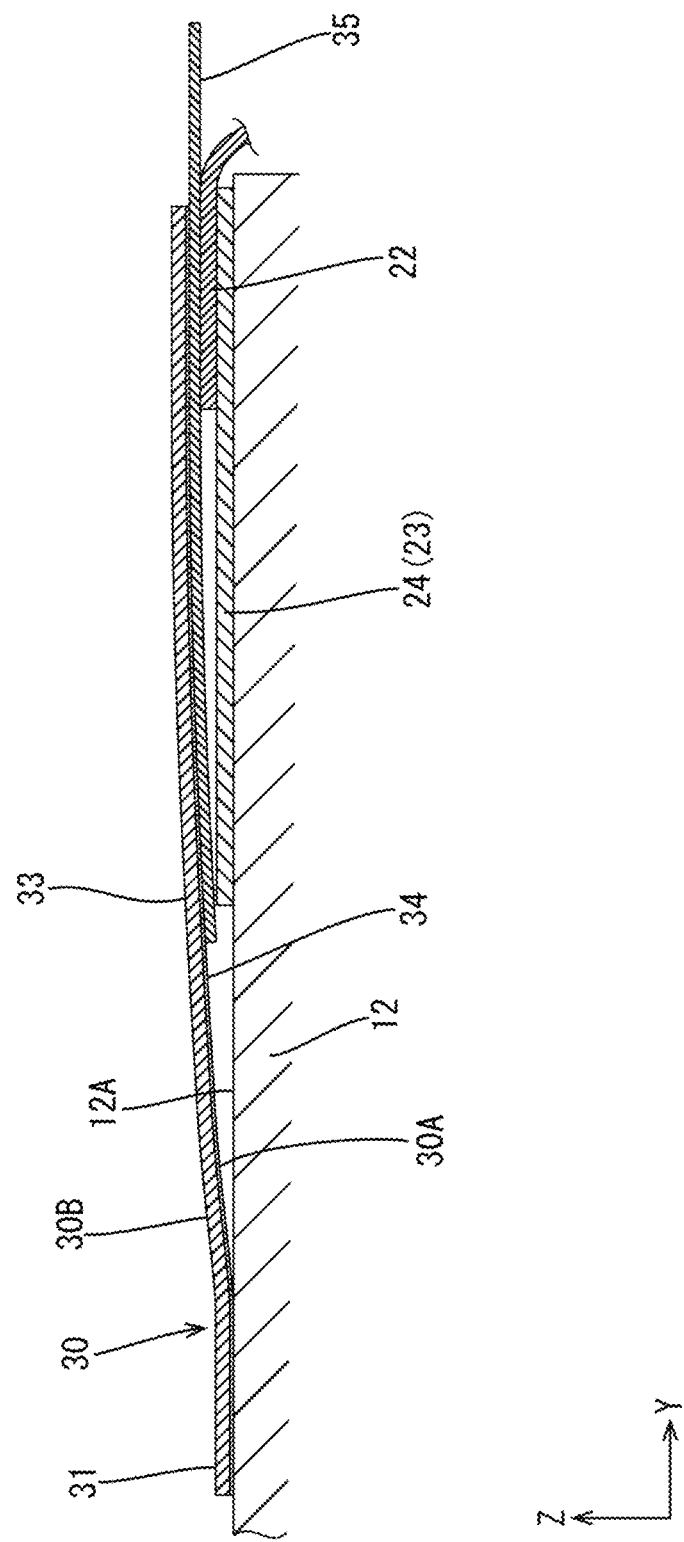
FIG. 3 is a cross-sectional view illustrating a tape and its vicinity (corresponding to a view taken along line III-III in FIG. 2).
Figure 5:
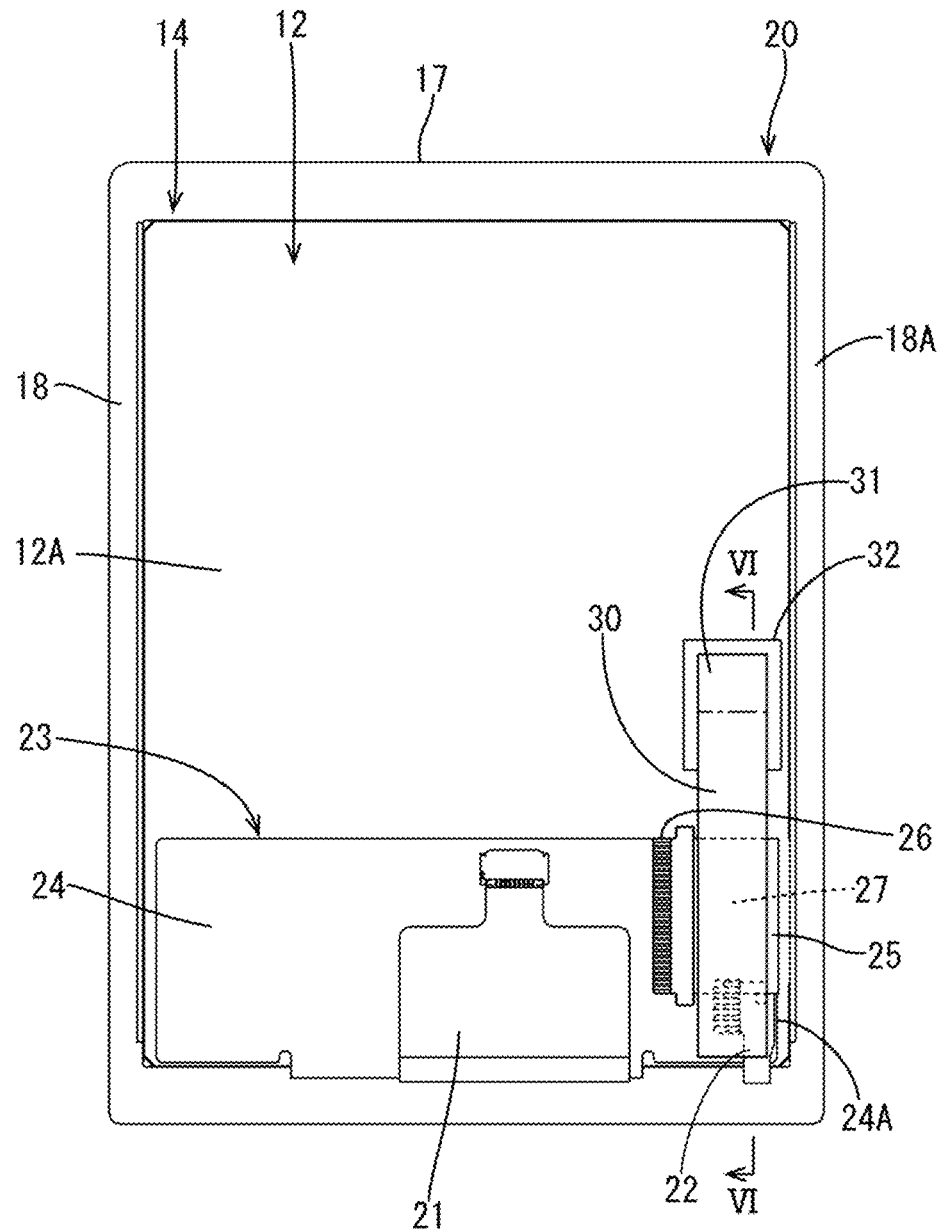
FIG. 5 illustrates a holding step.
Figure 6:
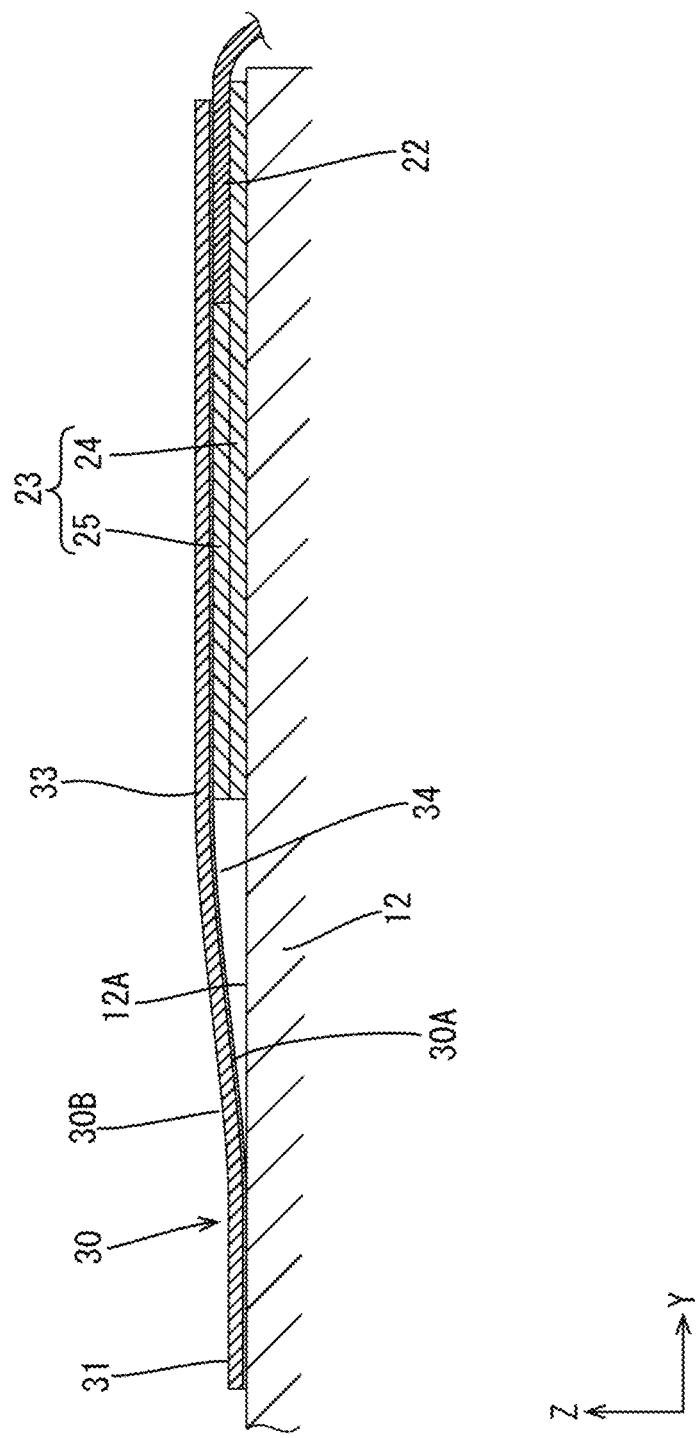
FIG. 6 is a cross-sectional view illustrating the tape and its vicinity in the holding step (corresponding to a view taken along line VI-VI in FIG. 5).

As illustrated in FIG. 3, the tape 30 includes a base material 33 with a band shape, a sticky layer 34 that is provided to a surface of the base material 33 that is opposite to the back surface 12A, and a film 35 (separator) that covers a large portion of the sticky layer 34. The film 35 is separated from the sticky layer 34 when the tape 30 is used. The tape 30 is a one-side sticky tape, and includes a sticky surface 30A on a side facing the back surface 12A and a non-sticky surface 30B on the side opposite to the back surface 12A. For example, the base material 33 may be formed of, but not limited to, paper. In addition, in the X-axis direction (the direction where the substrate body and the substrate extension portion are arranged), a length X1 (width) of the tape 30 is set to a value smaller than a length X2 of the substrate extension portion 25. In addition, the length of the tape 30 in the longitudinal direction (Y-axis direction) is set to a value larger than the length Y2 of the substrate extension portion 25. The tape 30 has the following structure: in a case where the substrate extension portion 25 is folded back to the substrate body 24 such that the overlapping portion 27 does not overlap the attached surface 18A (outer peripheral edge portion of the surface) as illustrated in FIG. 5 and FIG. 6, the folded-back substrate extension portion 25 is covered from the side opposite to the substrate body 24. Thus, the tape 30 can hold the substrate extension portion 25.

Next, a method of producing the liquid crystal display device 10 is described. The method of producing the liquid crystal display device 10 includes at least: an attaching step of integrating the liquid crystal display module 12 and the cover member 14 with the use of an adhesive to form the panel member 20; a substrate folding back step of folding back the substrate extension portion 25 to the substrate body 24 on the flexible substrate 23 in the panel member 20; a holding step, which is performed after the substrate folding back step, of holding the substrate extension portion 25 that is folded back to the substrate body 24 by covering the substrate extension portion 25 with the tape 30; a cleaning step, which is performed after the holding step, of cleaning the attached surface 18A of the panel member 20; and an attaching step of attaching the panel member 20 to the housing 13.

Figure 4:
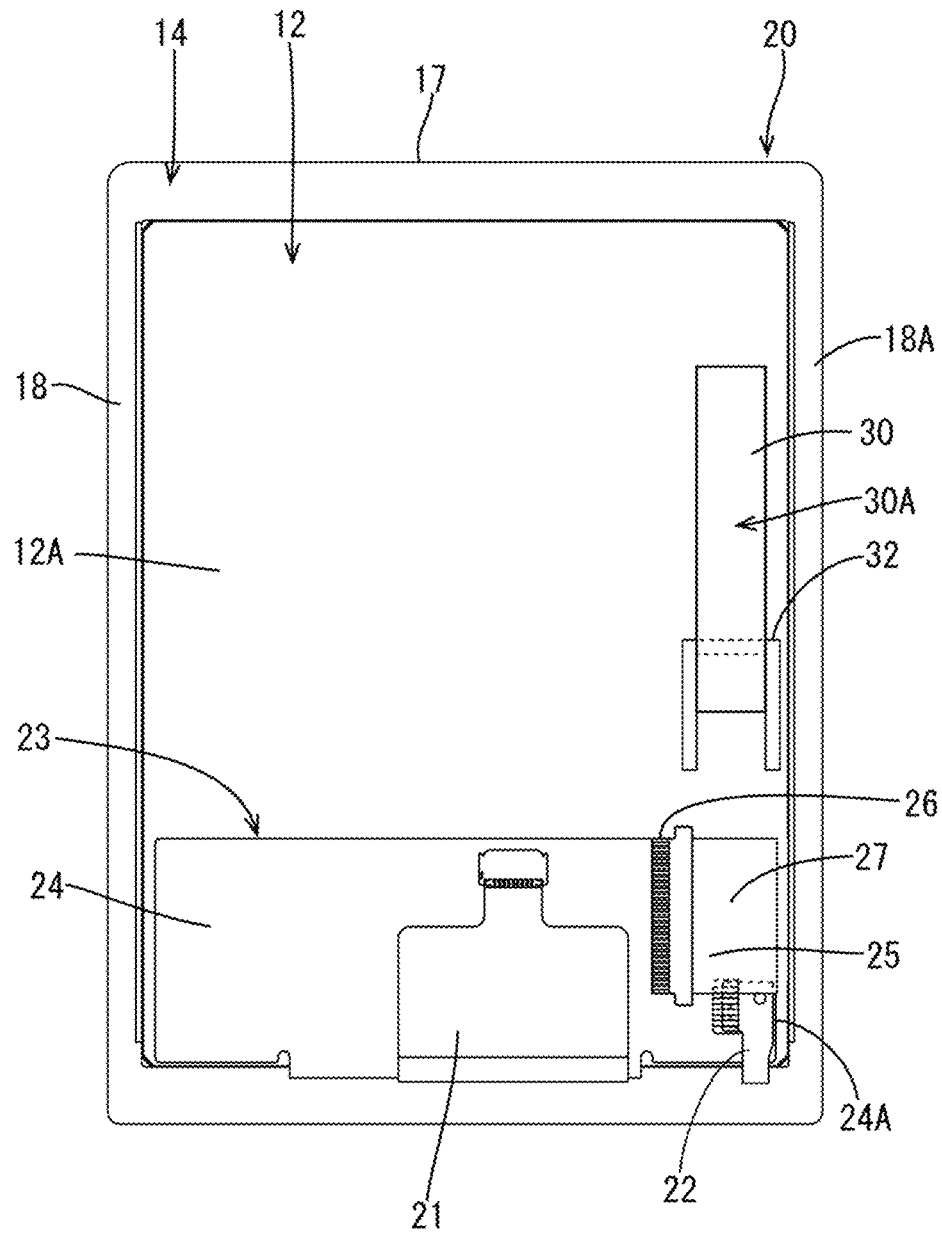
FIG. 4 illustrates a substrate folding back step.

In the substrate folding back step, the substrate extension portion 25 is folded back to the substrate body 24 while the tape 30 in the state where the film 35 is separated is turned over as illustrated in FIG. 4. Thus, the overlapping portion 27 does not overlap the attached surface 18A. In the substrate folding back step, for example, a line L1 (see FIG. 2) along the end face 24A of the substrate body 24 serves as a bend line of the substrate extension portion 25.

In the holding step, as illustrated in FIG. 5 and FIG. 6, the substrate extension portion 25 in the folded back state is covered with the tape 30 from the side opposite to the substrate body 24. Thus, the sticky layer 34 of the tape is pasted to the substrate body 24, the substrate extension portion 25, and the flexible substrate 22. Thus, the substrate extension portion 25 in the folded back state is held by the tape 30.

Figure 7:
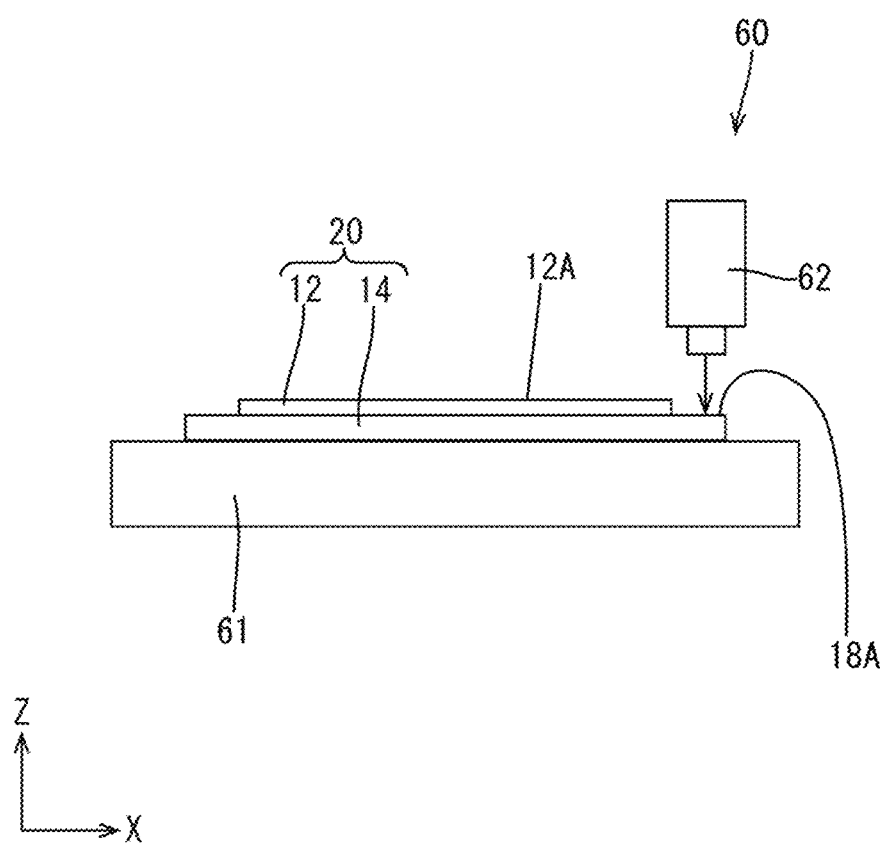
FIG. 7 illustrates a cleaning step.

In the cleaning step, as illustrated in FIG. 7, the attached surface 18A of the panel member 20 is cleaned using a plasma cleaning device 60 of an atmospheric pressure plasma type that emits atmospheric pressure plasma. The plasma cleaning device 60 includes a stage 61 on which the panel member 20 is placed, and an irradiation unit 62 that irradiates the panel member 20 with plasma. The irradiation unit 62 includes a pair of electrode portions and an air nozzle that are not shown. With an electric field generated between the pair of electrode portions, compressed air is jetted out from the air nozzle. As the compressed air passes between the pair of electrode portions, plasma is generated. Thus, the plasma is delivered from the irradiation unit 62 to the panel member 20. The irradiation unit 62 is disposed above the panel member 20 and can displace with respect to a horizontal direction (in XY plane).

In the cleaning step, the panel member 20 with the substrate extension portion 25 held by the tape 30 is placed on the stage 61 and the attached surface 18A of the panel member 20 is irradiated with the plasma from the irradiation unit 62. More specifically, the entire surface of the attached surface 18A is irradiated with the plasma in a manner that the plasma is delivered while the irradiation unit 62 is displaced along the attached surface 18A with a rectangular frame shape. Thus, the foreign substance adhering to the attached surface 18A can be decomposed and separated. Note that the structure of the plasma cleaning device 60 is not limited to the aforementioned structure.

In the attaching step, which is performed after the cleaning step, the attached surface 18A of the panel member 20 is attached to the end face of the frame portion 16 of the housing 13 by the adhesive layer 19 as illustrated in FIG. 1. Thus, the housing 13 and the panel member 20 can be assembled integrally and therefore, the liquid crystal display device 10 is completed.

Next, an effect of the present embodiment is described. In the liquid crystal display device 10 according to the present embodiment, the substrate extension portion 25 is folded back to the substrate body 24 and then, the folded-back substrate extension portion 25 is held by the tape 30. Thus, the overlapping portion 27 can be held in a state of not overlapping the attached surface 18A, and the attached surface 18A can be cleaned for sure before the attached surface 18A is attached to the housing 13 (another member). In addition, the surface (exposed surface) of the panel member 20 on the side opposite to the back surface 12A is the non-sticky surface 30B of the tape 30; therefore, dust or the like adheres less to the exposed surface of the tape 30.

Moreover, on the back surface 12A of the panel member 20, the mark 32 that determines the pasting position on the back surface 12A where the one end portion 31 of the tape 30 is pasted. Therefore, the tape 30 can be pasted at a predetermined position correctly.

In addition, at the distal end of the substrate extension portion 25, the terminal portion 26 is provided. The length X1 of the tape 30 is set to a value smaller than the length X2 of the substrate extension portion 25. When the length X1 of the tape 30 is set to a value smaller than the length X2 of the substrate extension portion 25, the tape 30 adheres less to the terminal portion 26 because when the substrate extension portion 25 folded back to the substrate body 24 is covered with the tape 30 as illustrated in FIG. 5, the tape 30 can be contained within the range of the substrate extension portion 25 in the X-axis direction. Thus, it is possible to suppress the situation in which the sticky agent of the tape 30 adheres to the terminal portion 26 so as to deteriorate the electric connection reliability in the terminal portion 26.

The panel member 20 includes the liquid crystal display module 12 including the display surface 11 that displays an image, and the cover member 14 covering the display surface 11. The attached surface 18A is a portion of the cover member 14. Before the outer peripheral edge portion of the cover member 14 (attached surface 18A) is attached to the housing 13, the attached surface 18A can be cleaned for sure.

As illustrated in FIG. 2, the length Y1 of the substrate body 24 is set to the value larger than the length Y2 of the substrate extension portion 25. Therefore, at the boundary between the substrate body 24 and the substrate extension portion 25, the stress concentration easily occurs; as a result, the substrate extension portion 25 can be folded back to the substrate body 24 for sure.

In addition, the method of producing the liquid crystal display device 10 includes: a substrate folding back step of folding back the substrate extension portion 25 to the substrate body 24; a holding step, which is performed after the substrate folding back step, of holding the substrate extension portion 25 that is folded back to the substrate body 24 by covering the substrate extension portion 25 with the tape 30 including the sticky surface 30A; and a cleaning step, which is performed after the holding step, of cleaning the attached surface 18A. In the holding step, the overlapping portion 27 can be held by using the tape 30 in the state of not overlapping the attached surface 18A. In the cleaning step, the attached surface 18A can be cleaned for sure. If the attached surface 18A should overlap the substrate extension portion 25, irradiating the attached surface 18A with the plasma may result in the irradiation of the substrate extension portion 25 with the plasma and the substrate extension portion 25 may be damaged. However, in the present embodiment, such a situation occurs less.

Second Embodiment

Figure 8:
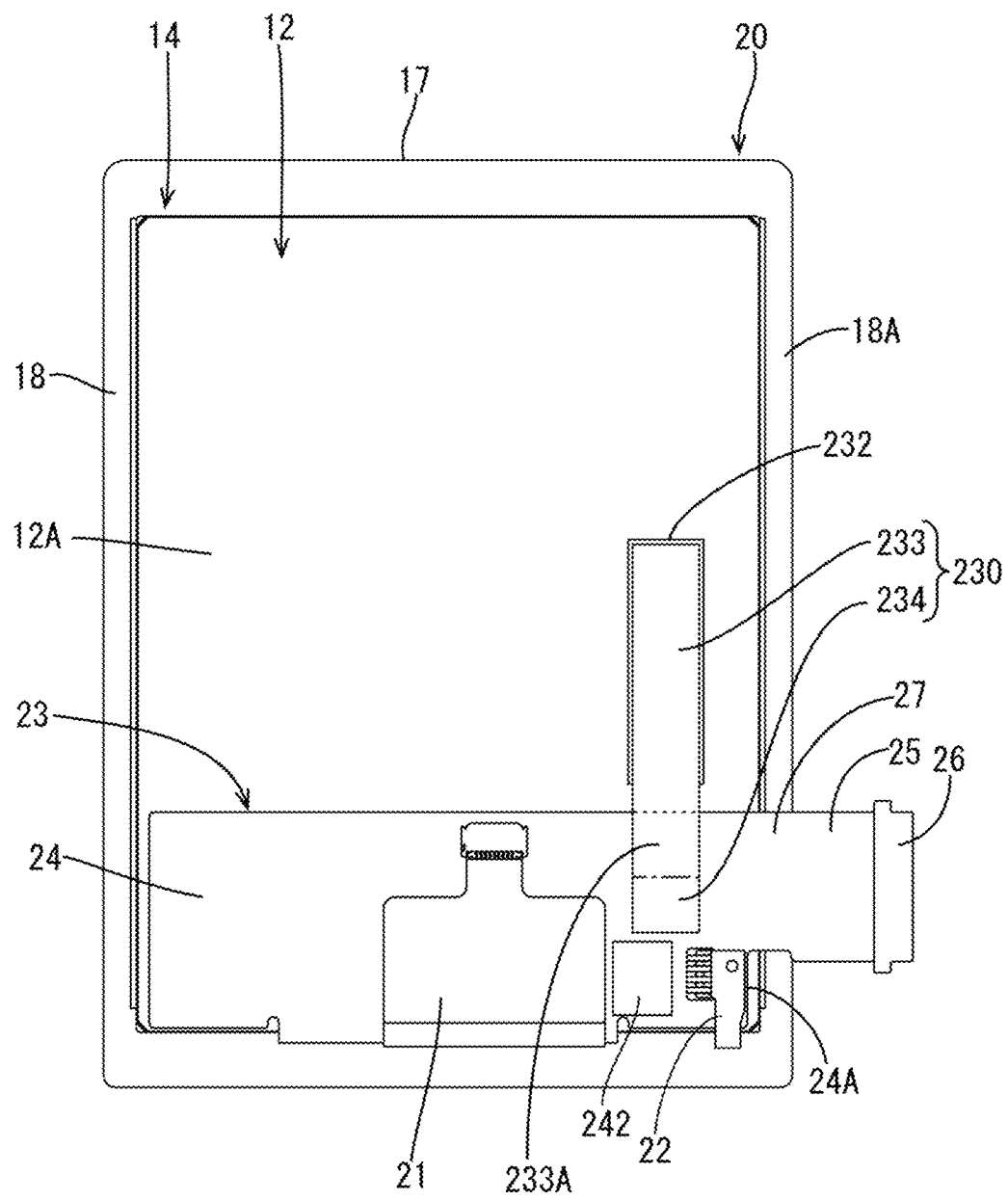
FIG. 8 is a diagram in which a panel member according to a second embodiment is viewed from a back surface side.
Figure 9:
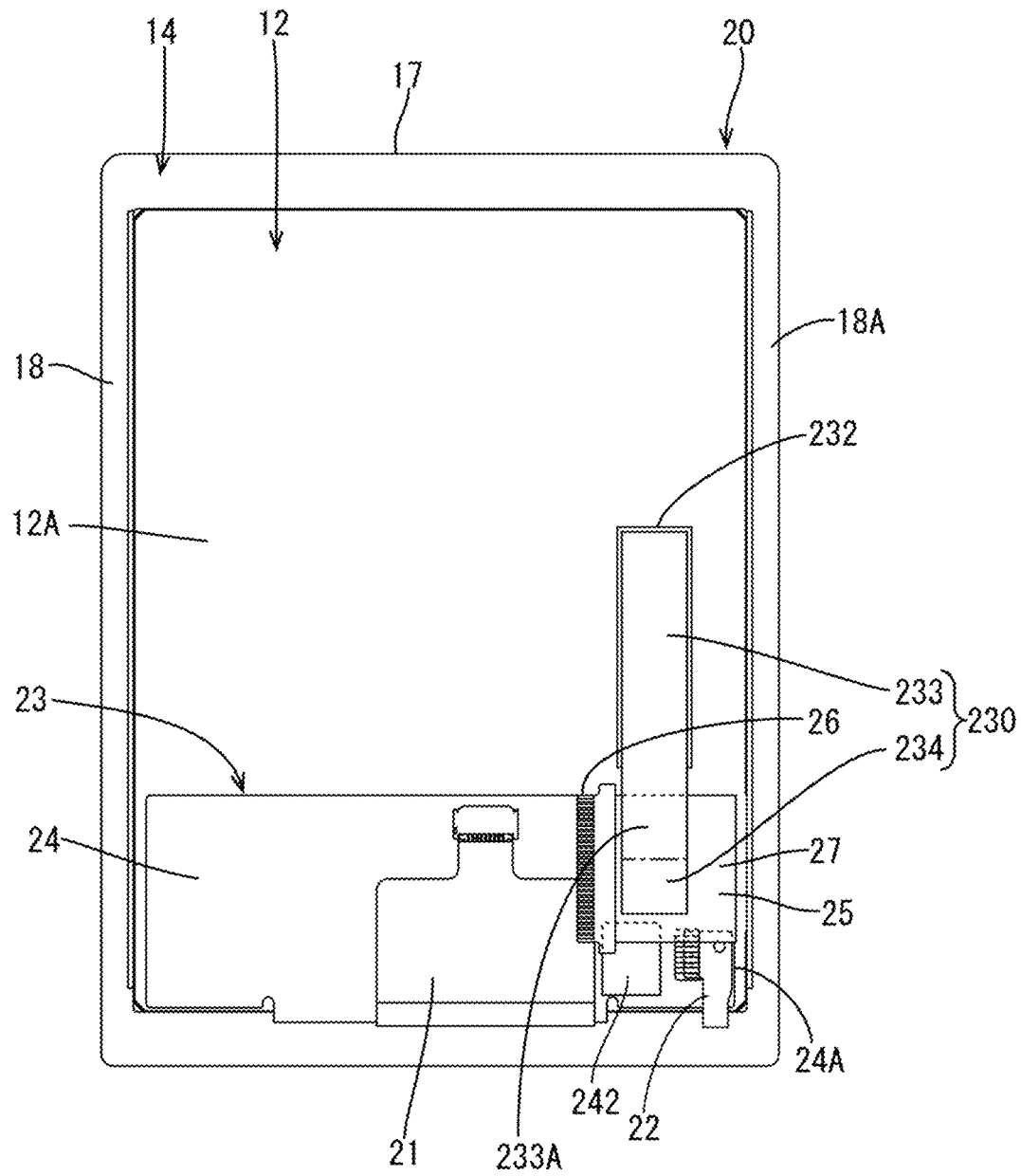
FIG. 9 illustrates a state where a substrate extension portion is folded back in the panel member in FIG. 8.

Next, a second embodiment of the technology described herein is described with reference to FIG. 8 and FIG. 9. The same part as that in the above embodiment is denoted with the same reference sign and the description of such a part is not repeated. In the present embodiment, the structure of the tape is different from that in the above embodiment. A tape 230 in the present embodiment excludes the film 35 (separator) shown in the first embodiment. As illustrated in FIG. 8, the tape 230 includes a sticky portion 233 whose surface on the flexible substrate 23 side is a sticky surface, and a non-sticky portion 234 whose surface on the flexible substrate 23 side is a non-sticky surface formed by a glue exclusion process, for example. The non-sticky portion 234 is one end portion of the tape 230 in the longitudinal direction, and the sticky portion 233 is a portion other than the non-sticky portion 234. The tape 230 is pasted to the back surface 12A of the panel member 20 in the sticky portion 233. A portion 233A of the sticky portion 233 is disposed in a manner of overlapping the flexible substrate 23. On the back surface 12A of the panel member 20, a mark 232 that determines the pasting position where the tape 230 is pasted is formed. The tape 230 is disposed at a position not interfering with (not overlapping) a circuit component 242 provided on the flexible substrate 23.

In the substrate folding back step in the present embodiment, the operator turns over the tape 230 to the middle in the longitudinal direction while holding the non-sticky portion 234 of the tape 230, and folds the substrate extension portion 25 back to the substrate body 24. In the subsequent holding step, the turned tape 230 is returned, and thus, the substrate extension portion 25 in the folded back state is covered with the tape 230 from the side opposite to the substrate body 24 as illustrated in FIG. 9. Thus, the substrate extension portion 25 in the folded back state can be held by the tape 230. In the present embodiment, the non-sticky portion 234 may be replaced by a low-sticky portion (portion with lower adhesion power than the sticky portion 233).

Other Embodiments

The technology described herein is not limited to the embodiments described above with reference to the drawings, and for example, the following embodiments are also included in the technical range of the technology described herein.

(1) In the above embodiments, the cover member attached liquid crystal display module 12 is described as the panel member; however, the technology described herein is not limited thereto.

(2) In the above embodiments, the display module includes the liquid crystal panel; however, the technology described herein is not limited thereto. The display module may include an organic EL panel.

(3) In the above embodiments, the plasma cleaning is performed in the cleaning step; however, the technology described herein is not limited thereto. For example, cleaning with excimer UV may be performed in the cleaning step.

(4) In the above embodiments, the attached surface 18A of the light-blocking portion 18 is described as the outer peripheral edge portion of the surface; however, the technology described herein is not limited thereto. For example, the cover member 14 may exclude the light-blocking portion 18, and in this case, the outer peripheral edge portion of the back surface of the glass base material 17 may be used as the outer peripheral edge portion of the surface.

The invention claimed is:

1. A display device comprising:
   a panel member;
   a flexible substrate including: a substrate body that is disposed in an area of a surface of the panel member inner than an outer peripheral edge portion of the surface; and a substrate extension portion that is extended from an outer peripheral edge portion of the substrate body to an outside of the panel member, the substrate extension portion including an overlapping portion overlapping a section of the outer peripheral edge portion of the surface; and
   a tape that is pasted to the area of the surface that is inner than the outer peripheral edge portion of the surface, the tape including a sticky surface opposed to the surface and a non-sticky surface on an opposite side from the surface, the tape covering the substrate extension portion that is folded back to the substrate body from an opposite side from the substrate body such that the overlapping portion does not overlap the outer peripheral edge portion of the surface to hold the substrate extension portion.

2. The display device according to claim 1, wherein the surface includes a mark that determines a pasting position at which an end portion of the tape is pasted to the surface.

3. The display device according to claim 1, wherein
   the substrate extension portion includes a terminal portion at a distal end thereof, and
   the tape has a length smaller than a length of the substrate extension portion in a direction in which the substrate body and the substrate extension portion are arranged.

4. The display device according to claim 1, wherein
   the panel member includes a display module and a cover member, the display module including a display surface for displaying an image, the cover member covering the display surface, and
   the outer peripheral edge portion of the surface includes a portion of the cover member.

5. The display device according to claim 1, wherein the substrate body has a length larger than a length of the substrate extension portion in a direction perpendicular to the direction in which the substrate body and the substrate extension portion are arranged among directions along a plate surface of the flexible substrate.

6. A method of producing a display device including a panel member and a flexible substrate that includes: a substrate body that is disposed to cover an area of a surface of the panel member inner than an outer peripheral edge portion of the surface; and a substrate extension portion that is extended from the outer peripheral edge portion of the substrate body to an outside of the panel member, the substrate extension portion including an overlapping portion overlapping a portion of the outer peripheral edge portion of the surface, the method comprising:
- a substrate folding back step of folding back the substrate extension portion to the substrate body such that the overlapping portion does not overlap the outer peripheral edge portion of the surface;
- a holding step of holding the substrate extension portion that is folded back to the substrate body by covering the substrate extension portion from a side opposite to the substrate body with a tape having a sticky surface that faces the surface after the substrate folding back step; and
- a cleaning step of cleaning the outer peripheral edge portion of the surface after the holding step.

\* \* \* \* \*